(12) United States Patent  
Chen et al.

(10) Patent No.: US 8,140,038 B2
(45) Date of Patent: Mar. 20, 2012

(54) ADAPTIVE RECEIVERS

(75) Inventors: Peng-Sen Chen, Zhubei (TW); Hsiang-Te Ho, Zhubei (TW)

(73) Assignee: ISSC Technologies Corp., Hsinchu (TW)

( * ) Notice: Subject to any disclaimer, the term of this patent is extended or adjusted under 35 U.S.C. 154(b) by 399 days.

(21) Appl. No.: 12/579,306

(22) Filed: Oct. 14, 2009

(65) Prior Publication Data
US 2011/0086606 A1   Apr. 14, 2011

(51) Int. Cl.
*H04B 1/12* (2006.01)
(52) U.S. Cl. .......................................... 455/257; 455/266
(58) Field of Classification Search .................. 455/255, 455/256, 257, 258, 259, 266
See application file for complete search history.

(56) References Cited

U.S. PATENT DOCUMENTS

| | | | |
|---|---|---|---|
| 5,479,452 A * | 12/1995 | Hayes et al. .................. 375/344 |
| 6,278,867 B1 * | 8/2001 | Northcutt et al. ............. 455/255 |
| 6,704,555 B2 * | 3/2004 | Sih et al. ..................... 455/245.1 |
| 7,113,751 B2 * | 9/2006 | Barak ............................ 455/76 |
| 7,689,185 B2 * | 3/2010 | Hur ............................ 455/161.1 |
| 8,073,414 B2 * | 12/2011 | Dubash et al. ............. 455/180.3 |
| 2004/0248540 A1 * | 12/2004 | Bilgic et al. ................. 455/295 |
| 2006/0281432 A1 * | 12/2006 | Isaac et al. ................... 455/323 |
| 2008/0096508 A1 * | 4/2008 | Luff ............................ 455/209 |

* cited by examiner

*Primary Examiner* — Blane J Jackson
(74) *Attorney, Agent, or Firm* — Alston & Bird LLP

(57) ABSTRACT

An adaptive receiver for receiving a radio frequency (RF) signal and converting the RF signal at an RF frequency $F_{RF}$ toward a low intermediate frequency $F_{IF}$ is disclosed. The adaptive receiver comprises a pair of band pass filters with a nominal center frequency $F_c$ equal to $F_{IF}$, a look-up table (LUT) configured to estimate a frequency offset $\Delta_f$, representing the center frequency of the band pass filter due to an operating temperature change and/or process variation, a micro controller configured to estimate the operating center frequency of the band pass filter ($=F_{IF}+\Delta_f$ with the frequency offset included) and use this new center frequency as the adaptive intermediate frequency $F_{IF,AD}$, and a local oscillator generates oscillating signals at a frequency $F_{LO}$ equal to $F_{RF}$ minus $F_{IF,AD}$. A temperature sensing device may also be included in this adaptive receiver.

7 Claims, 9 Drawing Sheets

ADAPTIVE RECEIVERS

TECHNICAL FIELD

The present invention relates generally to a receiver for receiving and tuning radio frequency (RF) signals and more specifically to an adaptive receiver for receiving RF signals and converting them into intermediate frequency (IF) signals.

BACKGROUND

RF receivers in general have been designed to convert incoming RF signals into IF signals and then convert IF signals to baseband. FIG. 1 is a diagram illustrating the frequencies of an incoming RF signal, a local oscillator signal and a converted IF signal in prior art. Referring to FIG. 1, a conventional RF receiver may receive an RF signal at a frequency $F_{RF}$, and convert the RF signal into an IF signal with a nominal intermediate frequency $F_{IF}$ by mixing the received RF signal with a local oscillator (LO) signal centered at $F_{LO}=F_{RF}-F_{IF}$. Although such a down-conversion can be done in one step with one mixer and one LO, sometimes, the received RF signal is first down-converted to a first IF with a first mixer and a first LO, and then down-converted to the nominal IF at a frequency $F_{IF}$ with a second mixer and a second LO. In what follows, it is assumed that such a RF-to-IF conversion is done in one step. Usually, a channel selection filter such as a band pass filter (BPF) or low pass filter (LPF) may be required to filter out unwanted image and interference signals so as to facilitate a baseband demodulator to detect desired information. The channel selection filter, however, may suffer from an issue of center frequency shift, which can significantly degrade a demodulated signal.

FIG. 2A is a diagram illustrating an exemplary frequency response of a BPF without any center frequency shift. Referring to FIG. 2A, a desirable BPF may have a center frequency $F_C$ equal to $F_{IF}$ so that no power deviation may occur between the two nominal half-power points $F_1$ (i.e., the lower 3 dB point) and $F_2$ (i.e., the upper 3 dB point).

However, some BPFs or LPFs may not have a frequency response as illustrated in FIG. 2A. For example, inaccuracy in the frequency response of a BPF may result from deviation in (trans-) conductance-to-capacitance ratio due to process variation and/or environmental temperature change. FIG. 2B is a diagram illustrating an exemplary frequency response of a BPF with a center frequency shift. Referring to FIG. 2B, the center frequency $F_C'$ of the BPF may be offset from $F_{IF}$ by $\Delta_f$, resulting in, for example, a 20 dB power deviation between the nominal half-power points $F_1$ and $F_2$. To address the issue caused by process variation and/or temperature change, an automatic tuning circuitry may be used to accurately control the filter frequency response, which may inevitably result in design complexity. Such complexity is undesirable, particularly for mobile communications applications where chip size, power consumption and cost per unit must be minimized.

BRIEF SUMMARY

An adaptive receiver is disclosed, which may obviate one or more problems resulting from the limitations and disadvantages of the prior art.

Examples of the present invention may provide an adaptive receiver for receiving a radio frequency (RF) signal and converting the RF signal at an RF frequency $F_{RF}$ toward an adaptive intermediate frequency. The adaptive receiver may comprise (1) a two-dimensional look-up table (LUT) containing the frequency offset values, $\Delta_f$, for a desired range of temperatures and process corners, (2) given the LUT, temperature and process corner values, a micro controller configured to estimate the center frequency of a BPF: $F_C=F_{IF}+\Delta_f$, and (3) a local oscillator to generate sinusoidal signals at a frequency $F_{LO}$ equal to $F_{RF}$ minus $F_C$. In the above, $F_C$ is an estimated center frequency of the BPF in the presence of temperature changes and process corner variations. The adaptive receiver uses $F_C$ as an "adaptive" intermediate frequency, also denoted as $F_{IF,AD}$.

Oftentimes, one may not know either the temperature or process corner values. In that case, examples of the present invention may provide an adaptive receiver that comprises (1) a one-dimensional LUT containing the frequency offset values, $\Delta_f$, for a desired range of two-tone voltage differences, wherein a measurement procedure is required to obtain the two-tone voltage differences, (2) a micro controller configured to estimate an adaptive intermediate frequency $F_{IF,AD}$ ($=F_{IF}+\Delta_f$) based on the measured two-tone voltage differences, and (3) a local oscillator to generate sinusoidal signals at a frequency $F_{LO}$ equal to $F_{RF}$ minus $F_{IF,AD}$. In one example, the two-tone measurement procedure may be performed before an adaptive IF is estimated.

As another alternative to the above example, assuming that one can measure the temperature change accurately and hence only perform the two-tone measurement after power-on, the adaptive receiver may comprise (1) a one-dimensional LUT containing the frequency offset values, $\Delta_f$, for a desired range of two-tone voltage differences, wherein a measurement procedure performed after the adaptive receiver is powered-on to obtain the two-tone voltage differences at a temperature $T_{on}$, (2) a temperature sensing device, when working together with a microprocessor, to measure the temperature difference $\Delta_T$ between the operating temperature $T_{op}$ and $T_{on}$, (3) a micro controller configured to calculate an adaptive intermediate frequency $F_{IF,AD}$ ($=F_{IF}+\Delta_f+F_{slope}*\Delta_T$) based on $\Delta_f$, a pre-estimated temperature coefficient, $F_{slope}$, and the temperature difference $\Delta_T=T_{op}-T_{on}$, and (4) a local oscillator to generate oscillating signals at a frequency $F_{LO}$ equal to $F_{RF}$ minus $F_{IF,AD}$. In this example, the two-tone measurement is performed only once after power on and the temperature sensing device, when working together with the microprocessor 13, is assumed to be capable of monitoring the temperature accurately. An adaptive intermediate frequency may thus be estimated with an accurate "temperature difference" value.

Examples of the present invention may also provide an adaptive receiver for receiving a radio frequency (RF) signal and converting the RF signal at an RF frequency $F_{RF}$ toward an adaptive intermediate frequency. The adaptive receiver may comprise (1) a two-dimensional look-up table (LUT) containing the frequency offset values, $\Delta_f$, for a desired range of temperatures and process corners, (2) a micro controller configured to estimate the center frequency of the BPF based on the known temperature and process corner: $F_C=F_{IF}+\Delta_f$, and (3) a local oscillator to generate sinusoidal signals at a frequency $F_{LO}=F_{RF}-F_{IF,AD}$. The local oscillator further comprises a prescaler configure to operate in a first mode with a first prescaler factor N and a second mode with a second prescaler factor (N+1), N being a positive integer, and a sigma-delta modulator configured to generate a carry signal every M cycles of a reference clock to switch the prescaler from the first mode to the second mode.

Examples of the present invention may further provide an adaptive receiver for receiving a radio frequency (RF) signal and converting the RF signal at an RF frequency $F_{RF}$ toward an adaptive intermediate frequency. The adaptive receiver may comprise (1) a two-dimensional look-up table (LUT)

containing the frequency offset values, $\Delta_f$, for a desired range of temperatures and process corners, (2) a micro controller configured to estimate the center frequency of the BPF based on the known temperature and process corner: $F_C = F_{IF} + \Delta_f$, and (3) a local oscillator to generate sinusoidal signals at a frequency $F_{LO} = F_{RF} - F_{IF,AD}$. The local oscillator further comprises a crystal oscillator configured to generate a reference clock at a frequency $F_0$, wherein $F_0$ is a function of $F_D$, a prescaler configured to operate in a first mode with a first prescaler factor N and a second mode with a second prescaler factor (N+1), N being a positive integer, and a sigma-delta modulator configured to generate a carry signal to switch the prescaler from the first mode to the second mode.

Additional features and advantages of the present invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one example of the present invention and together with the description, serves to explain the principles of the invention.

BRIEF DESCRIPTION OF THE DRAWINGS

The foregoing summary, as well as the following detailed description of the invention, will be better understood when read in conjunction with the appended drawings. For the purpose of illustrating the invention, there are shown in the drawings examples which are presently preferred. It should be understood, however, that the invention is not limited to the precise arrangements and instrumentalities shown.

In the drawings.

DETAILED DESCRIPTION

In this detailed description, for purposes of explanation, numerous specific details are set forth to illustrate examples of the present invention. One skilled in the art will appreciate, however, that examples of the present invention may be practiced without these specific details. Furthermore, one skilled in the art can readily appreciate that the specific sequences in which methods are presented and performed are illustrative and it is contemplated that the sequences can be varied and still remain within the spirit and scope of embodiments of the present invention.

Figure 1:
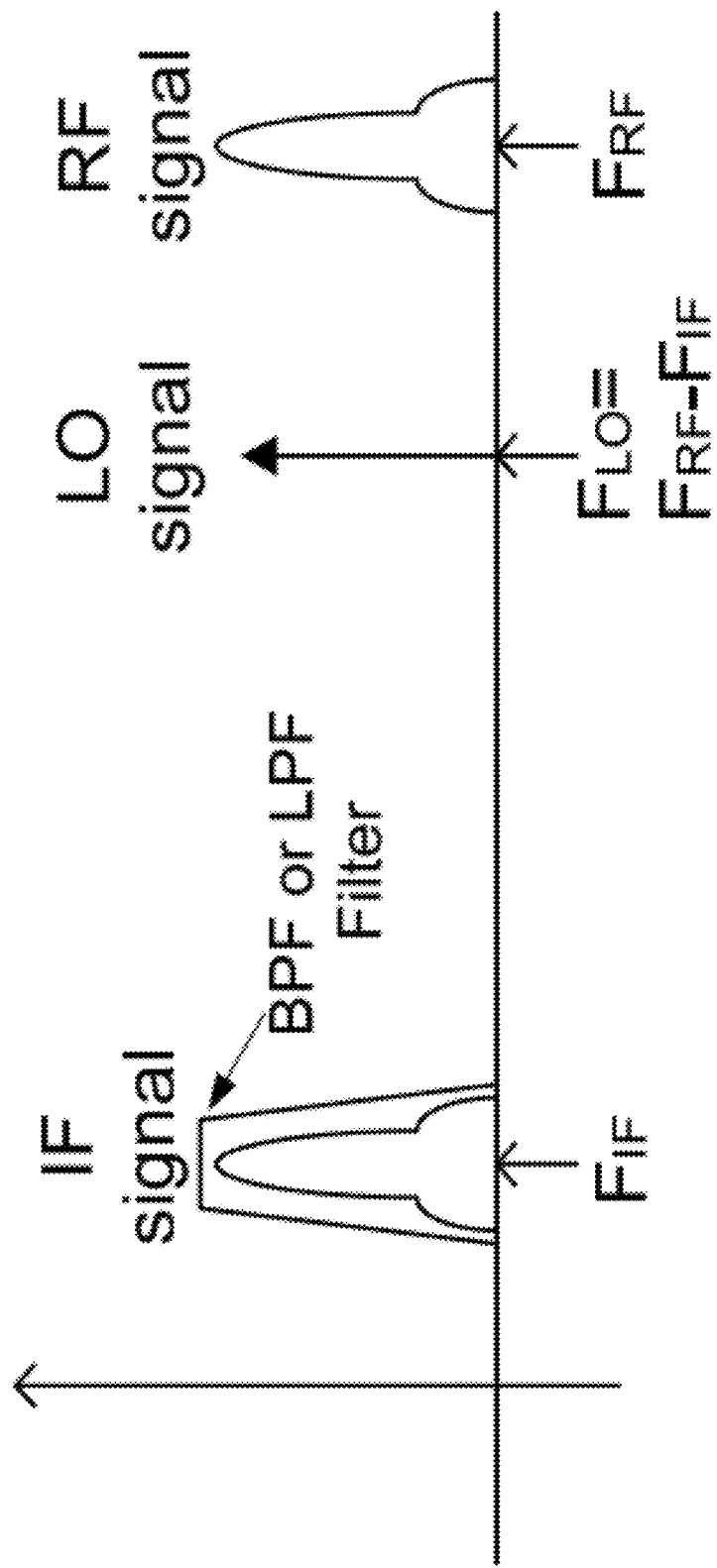
FIG. 1 is a diagram illustrating the frequencies of an incoming radio frequency (RF) signal, a local oscillator signal and a converted intermediate frequency (IF) signal in prior art.
Figure 2A:
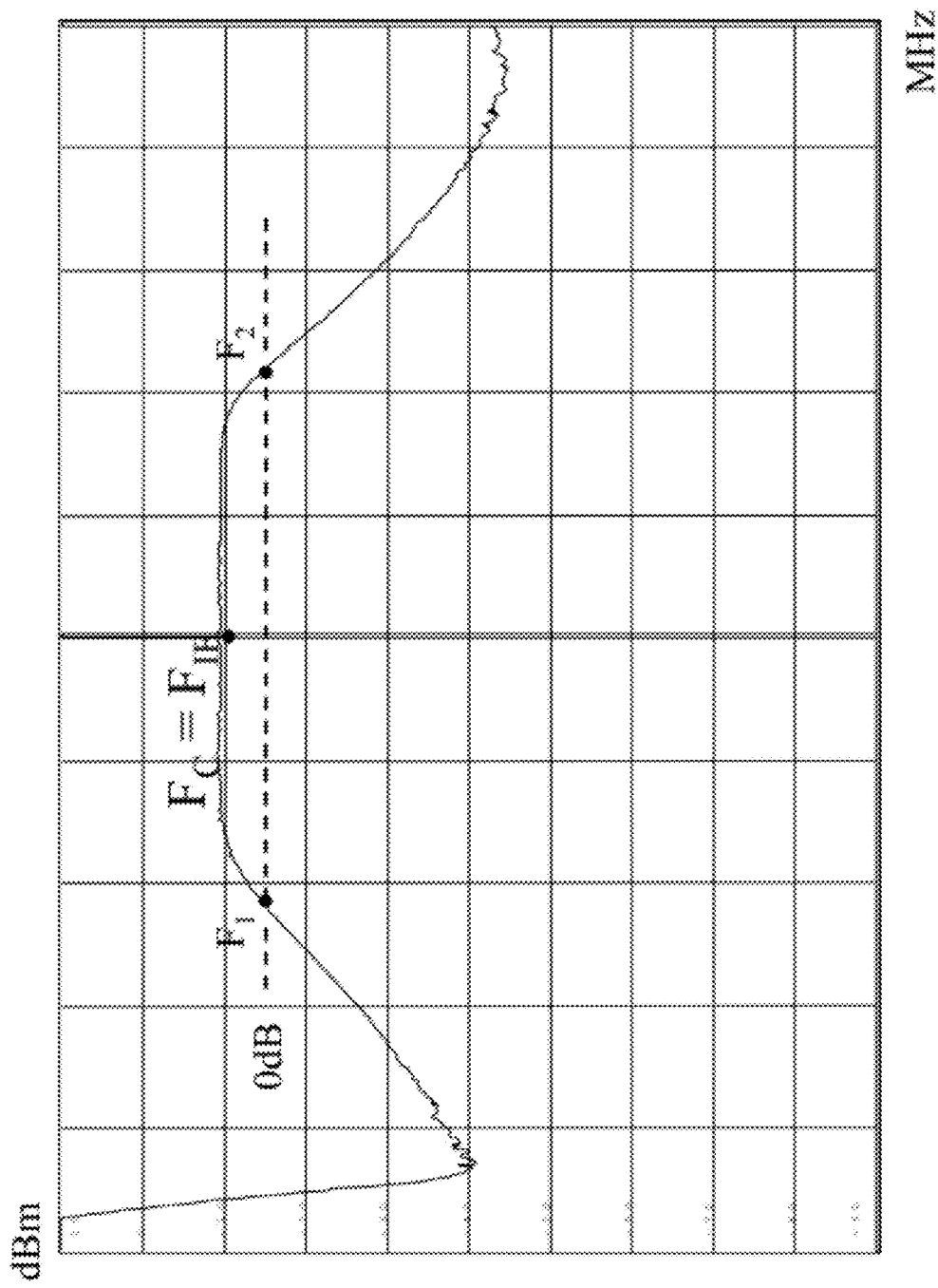
FIG. 2A is a diagram illustrating an exemplary frequency response of a band pass filter without any center frequency shift.
Figure 2B:
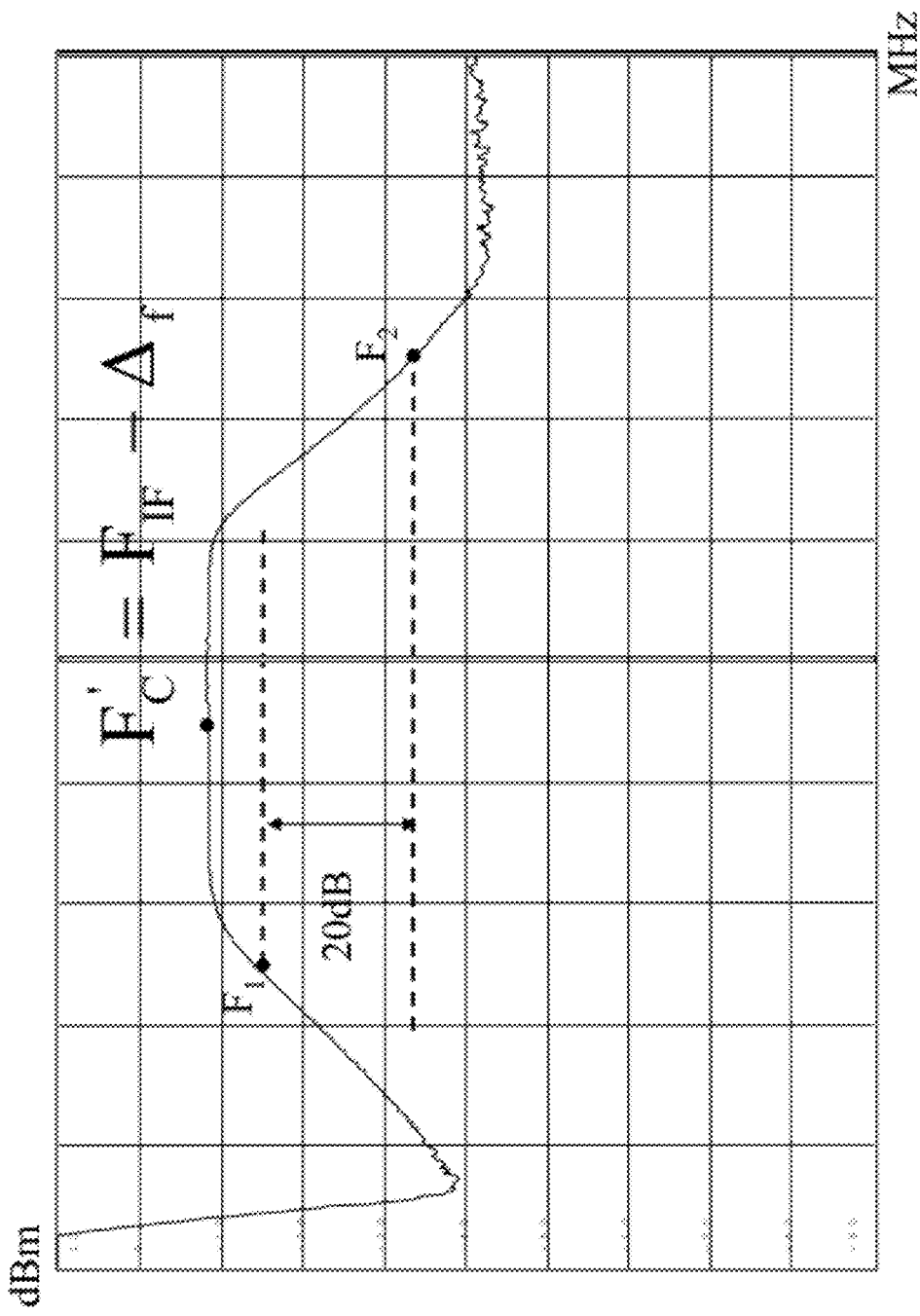
FIG. 2B is a diagram illustrating an exemplary frequency response of a band pass filter with a center frequency shift.
Figure 3:
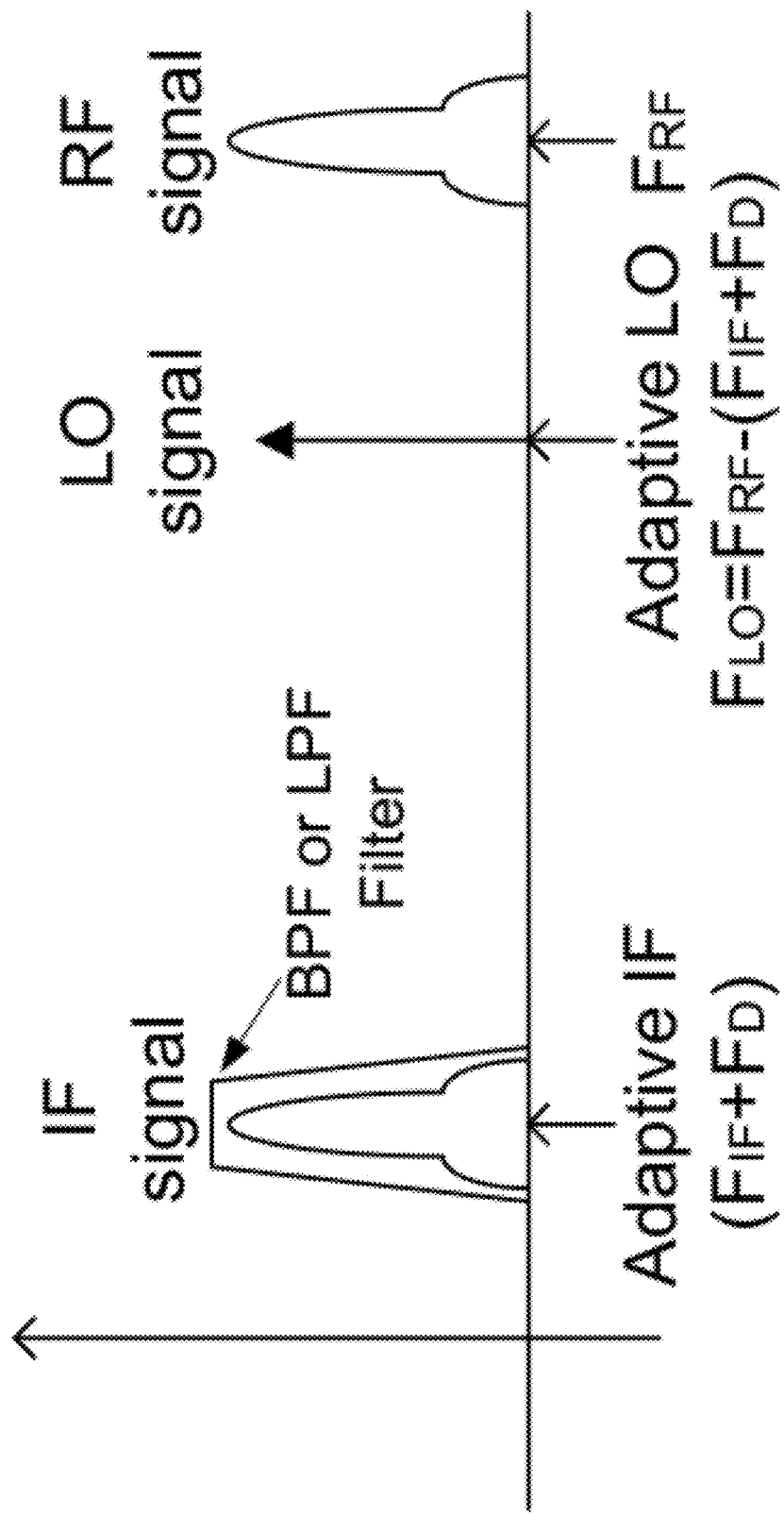
FIG. 3 is a schematic diagram illustrating a method of converting RF signals into IF signals consistent with an example of the present invention.

FIG. 3 is a schematic diagram illustrating a method of converting radio frequency (RF) signals into intermediate frequency (IF) signals consistent with an example of the present invention. Referring to FIG. 3, an incoming RF signal at a frequency $F_{RF}$ may be received by an adaptive receiver constructed in accordance with the present invention. The incoming RF signal may be converted into an IF signal with its nominal (center) intermediate frequency at $F_{IF}$ by the adaptive receiver. In one example according to the present invention, $F_{RF}$ may range from approximately 2.4 gigahertz (GHz) to 2.48 GHz, and $F_{IF}$ may range from approximately 1 megahertz (MHz) to 1.5 MHz. In another example, the incoming RF signal may be modulated in accordance with the IEEE 802.11a standard such that $F_{RF}$ may range from approximately 5.15 GHz to 5.35 GHz or alternatively range from approximately 5.725 GHz to 5.825 GHz.

To address the issue of temperature change and/or process corner variation, a frequency offset "$\Delta_f$" may be generated by the adaptive receiver to compensate for the frequency shift in $F_{IF}$ due to either environmental temperature change or process variations. Accordingly, an adaptive frequency $F_{IF,AD}$ may be identified, where $F_{IF,AD} = F_{IF} + \Delta_f$. A local oscillator (LO) may be configured to generate an LO signal at a frequency $F_{LO} = F_{RF} - F_{IF,AD} = F_{RF} - (F_{IF} + \Delta_f)$. The frequency offset and the LO signal will be further discussed below.

Figure 4A:
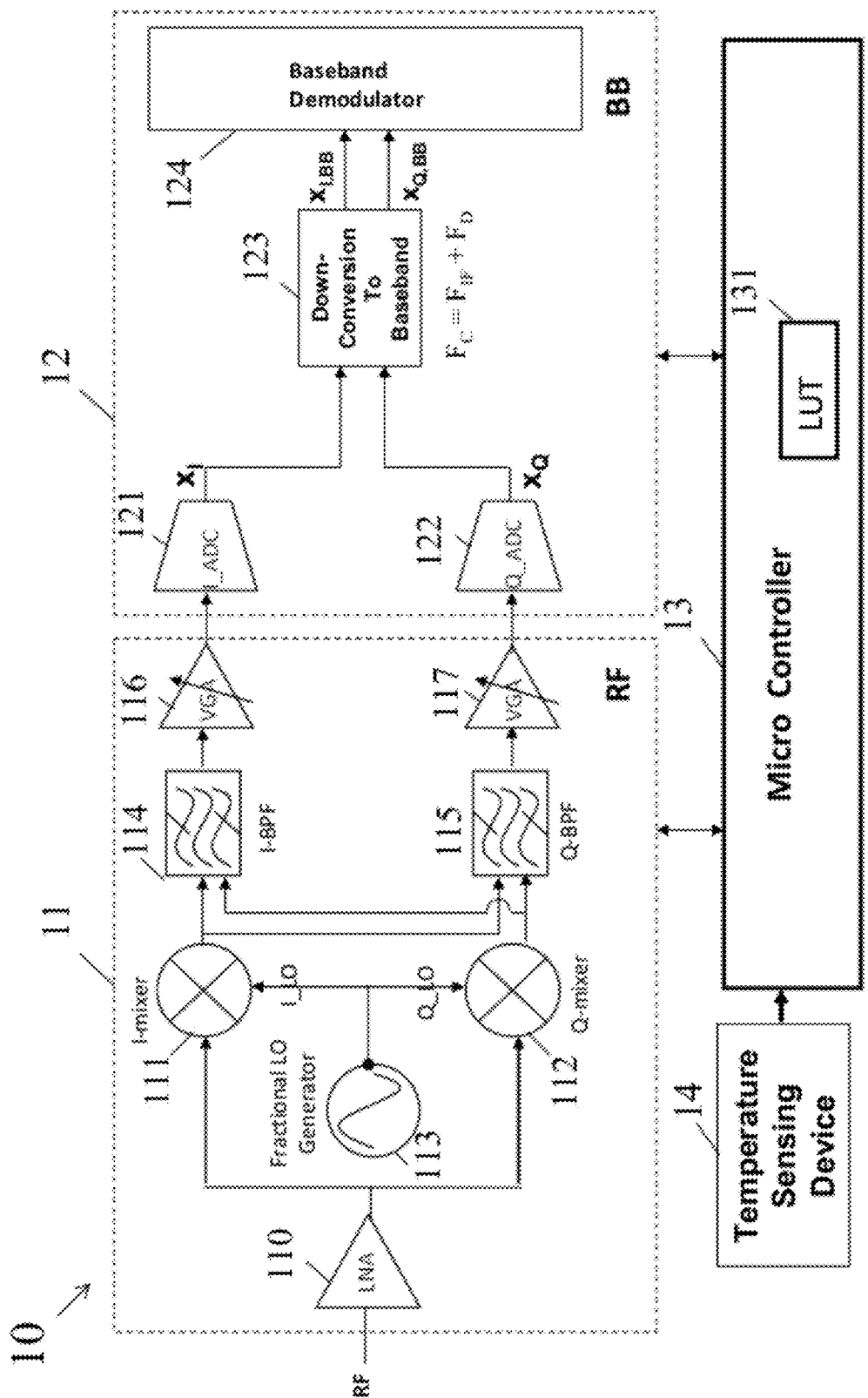
FIG. 4A is a block diagram of an adaptive receiver consistent with an example of the present invention.

FIG. 4A is a block diagram of an adaptive receiver 10 consistent with an example of the present invention. The adaptive receiver 10 may be configured to perform signal amplification, frequency down conversion, filtering, channel selection, analog-to-digital conversion and the like. Referring to FIG. 4A, the adaptive receiver 10 may include an RF section 11, a baseband (BB) section 12, a micro controller 13 and a temperature sensing device 14. An incoming RF signal may be amplified by a low noise amplifier (LNA) 110. An output RF signal from the LNA 110 may then be processed in an in-phase (I) path and a quadrature-phase (Q) path. Specifically, in the I-path, a first frequency converter such as an I-mixer 111 of a first mixer stage in the RF section 11 may down-convert the RF signal from the LNA 110 to an adaptive frequency $(F_{IF} + \Delta_f)$ based on a first LO signal, i.e., an I_LO signal, from a fractional LO generator 113 operating at a frequency $F_{LO} = F_{RF} - (F_{IF} + \Delta_f)$. Next, a first channel selection filter such as an in-phase channel bandpass filter, I-BPF 114, with a center frequency $F_C$ equal to $(F_{IF} + \Delta_f)$ may filter image or interference signals. The I-BPF 114 has two inputs, with the first being the output of the I-mixer 111 and the second being the output of the Q-mixer 112. The output signal of the I-BPF 114 may be processed in a first variable gain amplifier (VGA) 116 and in turn a first analog-to-digital converter (ADC), I-ADC 121, before sent to a down-conversion to baseband 123 in the BB section 12. The first VGA 116 may function to maintain a desired output signal level by controlling its gain.

Similarly, in the Q-path, a second frequency converter such as a Q-mixer 112 of the first mixer stage in the RF section 11 may down-convert the RF signal from the LNA 110 to the adaptive frequency $(F_{IF} + \Delta_f)$ based on a second LO signal, i.e., a Q_LO signal, from the fractional LO generator 113 operating at the frequency $F_{LO} = F_{RF} - (F_{IF} + \Delta_f)$. The I_LO and Q_LO signals transmit at the same frequency in quadrature phase to each other. Next, a quadrature channel selection filter such as a Q-BPF 115 with the center frequency $F_C=(F_{IF}+\Delta_f)$ may filter image or interference signals. The Q-BPF 115 has also two inputs, with its first input being the output of the I-mixer 111 and its second input being the output of the Q-mixer 112. The output signal of the Q-BPF 114 may be processed in a second VGA 117 and in turn a second ADC, Q-ADC 122, before sent to a down-conversion to baseband 123 in the BB section 12.

The two inputs ($x_I$ and $x_Q$) to the down-conversion to baseband 123, when considered as complex equivalent signal $x_I+ix_Q$, where $i=\sqrt{-1}$, is a signal with a center frequency at $F_C=(F_{IF}+\Delta_f)$. The down-conversion to baseband 123, equivalently a pair of second-stage I/Q mixers with the same center frequency at $F_C=(F_{IF}+\Delta_f)$, down-converts the complex equivalent signal to a pair of I/Q baseband signals, $x_{I,BB}$ and $x_{Q,BB}$. Subsequently, a demodulator 124 may process the output signal from the down conversion to baseband 123 to retrieve the modulated data.

The fractional LO generator 113 may be configured to generate the I_LO and Q_LO signals at $F_{LO}=F_{RF}-(F_{IF}+\Delta_f)$, based on a reference clock frequency $F_0$, a first value $N_D$ related to the frequency shift $F_D$, and a second value $N_{CH}$ related to the period a carry signal. In one example, the first value $N_D$ and the second value $N_{CH}$ may be related to a mean division ratio of a pre-scaler or frequency divider, which will be discussed by reference to FIG. 5A. In another example, the first value $N_D$ may be related to a trimming ratio of a reference clock and the second value $N_{CH}$ may be related to a division ratio of the pre-scaler, which will be discussed by reference to FIG. 5B. Furthermore, the oscillator frequency $F_{LO}=F_{RF}-(F_{IF}+\Delta_f)$ and the center frequency $F_C=(F_{IF}+\Delta_f)$ may be non-integer multiples of the reference clock frequency $F_0$ and may include a fractional part.

The first BPF 114 and the second BPF 115 in one example may be designed with a center frequency in a relatively low IF band, for example, ranging from approximately 1 MHz to 1.5 MHz. The center frequency may change as the environmental temperature changes. Table 1 below lists an example for IF center frequency variation at different temperatures, namely 95 degrees Celsius (° C.), 25° C. and −45° C. and for all process corners from TTT to FFF. Hence, it is a two-dimensional table. The $F_{IF}+\Delta_f$ values shown in Table 1 are simulation results. The nominal intermediate frequency is at 1.248 MHz. In reality, one may not know the process corner of a specific receiver. Neither will a temperature sensing device 14 provide decent absolute accuracy in temperature measurement. Instead, a typical temperature sensing device 14, when working together with the microprocessor 13, can provide a decent accuracy while measuring temperature difference $\Delta_T$. Therefore, Table 1 is used to explain our concept below assuming one knows exactly both the temperature and the process corner. In reality, a calibration process is used to estimate the center frequency of the BPF accurately. This process will be detailed later.

TABLE 1

| ($F_{IF}+\Delta_f$ values in MHz) | | | |
|---|---|---|---|
| | temp. | | |
| corner | 95° C. | 25° C. | −45° C. |
| TTT | 1.151 | 1.248 | 1.315 |
| FFT | 1.375 | 1.441 | 1.478 |
| SST | 0.919 | 1.053 | 1.164 |

TABLE 1-continued

| ($F_{IF}+\Delta_f$ values in MHz) | | | |
|---|---|---|---|
| | temp. | | |
| corner | 95° C. | 25° C. | −45° C. |
| FFF | 1.391 | 1.451 | 1.485 |
| SSS | 0.902 | 1.040 | 1.134 |
| SFT | 1.125 | 1.229 | 1.296 |
| FST | 1.180 | 1.273 | 1.326 |
| SFF | 1.141 | 1.241 | 1.304 |
| SFS | 1.108 | 1.219 | 1.289 |
| FSF | 1.196 | 1.281 | 1.334 |
| FSS | 1.165 | 1.260 | 1.323 |

In Table 1, the process corner may refer to a semiconductor process by which the adaptive receiver 10 may be fabricated. The characters "T", "F" and "S" may represent typical, fast and slow, respectively. For example, TTT may mean typical split for thin oxide devices, typical split for thick oxide devices, and typical split for poly resistors. Furthermore, shown in bold characters in Table 1, a typical center frequency shift may be 1.248 MHz (TTT corner at 25° C.), the maximum center frequency shift may be 1.485 MHz (FFF corner at −45° C.) and the minimum center frequency shift may be 0.902 MHz (SSS corner at 95° C.). Moreover, given a same process corner, the maximum frequency deviation may fall within approximately 250 kilohertz (KHz). For example, the maximum frequency deviation may take place at the SST corner with a value of 245 KHz (=1.164 MHz−0.919 MHz).

The process corner information may be accessible from, for example, the manufacturer of the adaptive receiver 10. Furthermore, the temperature information may be obtained by the temperature sensing device 14, which may be configured to detect the environmental temperature during a power-on stage of the adaptive receiver 10 is turned on. Given the information on the process corner and the environmental temperature, as previously discussed with reference to FIG. 3, the $F_{IF}+\Delta_f$ values may be estimated. In the present example, for simplicity, only three temperatures are illustrated in Table 1 for reference. In one example according to the present invention, Table 1 may be expanded to cover more temperature entries in the same temperature range between −45° C. and 95° C. or in a desirable temperature range between, for example, approximately 5° C. and 95° C. Such an expanded table may be built in a two-dimensional look-up table (LUT) 131. The LUT 131 may allow interpolation and extrapolation in a predetermined temperature range. Accordingly, the micro controller 13 may be configured to receive temperature information from the temperature sensing device 14 and calculate an adjusted IF by indexing the first LUT 131.

Our discussions have been focused on how the center frequency $F_c$ of the band pass filter can vary as a function of temperature and process corner. The innovation resides in using this "varying" center frequency as the intermediately frequency, $F_{IF,AD}$, for an adaptive receiver. The above discussions assume that the temperature and the process corner of the adaptive receiver are both known. Oftentimes, a temperature sensing device 14 does not provide an accurate absolute temperature, but the temperature difference can be measured with a decent accuracy. Typically, one does not know the process corner for a specific chip either. In that case, a calibration procedure can be used to estimate the $F_{IF}+\Delta_f$ value.

Before describing a complete calibration procedure, a measurement procedure for estimating the $F_{IF}+\Delta_f$ is first proposed. The measurement can be used even if neither the operating temperature nor the process corner is known. FIG.

Figure 4B:
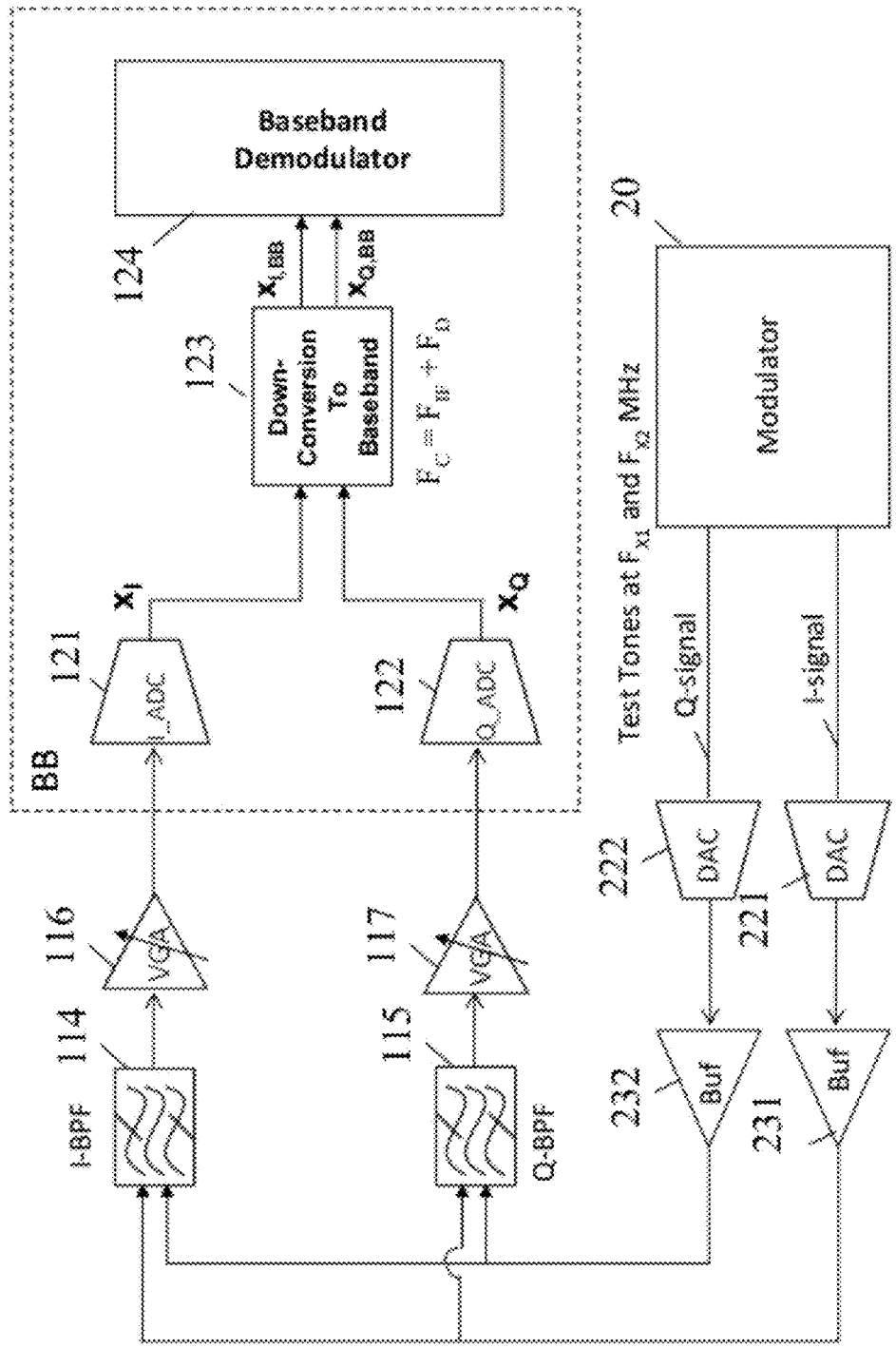
FIG. 4B is a block diagram illustrating a method of calibrating a band pass filter consistent with an example of the present invention.

4B is a block diagram illustrating a two-tone measurement method for estimating the center frequency of the band pass filter consistent with the above example of the present invention. The two-tone measurement may be performed during a power-on stage of the adaptive receiver 10. Referring to FIG. 4B, a modulator 20 may be configured to generate first a test tone at a frequency $F_{X1}$ at a time $T_1$ and then generate a second test tone at a frequency $F_{X2}$ at a time $T_2$. The in-phase component of the first test tone, denoted "I-signal" in FIG. 4B, may be sent, via an I-path, through a first digital-to-analog converter (DAC) 221 and a first buffer 231 to both I-BPF 114 and Q-BPF 115, and the quadrature component of the first tone, denoted "Q-signal" in FIG. 4B, may be sent, via a Q-path, through a second DAC 222 and a second buffer 232 to both I-BPF 114 and Q-BPF 115 at $T_1$. The first signal voltage level $V_{FX1}$, indicating the strength of the first test tone received at the demodulator 124, may be detected and then stored in a register (not shown).

Subsequently, the in-phase component of the second test tone, denoted "I-signal" in FIG. 4B, may be sent, via the I-path, through the first DAC 221 and the first buffer 231 to both I-BPF 114 and Q-BPF 115, and the quadrature component of the second test tone, denoted "Q-signal" in FIG. 4B, may be sent, via the Q-path, through the second DAC 222 and the second buffer 232 to both I-BPF 114 and Q-BPF 115 at the second time point $T_2$. A second signal voltage level $V_{FX2}$, indicating the strength of the second test tone received at the demodulator 124, may be detected and then stored in the register (not shown). It is assumed that the temperature change is negligible during the above two-tone tests.

The first voltage level $V_{FX1}$ and the second voltage level $V_{FX2}$ may be compared with each other, resulting in a difference value $\Delta V_{FX2-FX1}$ ($=V_{FX2}-V_{FX1}$) which may contain information on the center frequency shift $\Delta_f$ in the nominal intermediate frequency due to both the ambient temperature change and the process corner variation. Table 2 below lists examples of $\Delta_f$ values for different $\Delta V_{FX2-FX1}$ values.

TABLE 2

| $\Delta V_{FX2-FX1}$ (dB) | $\Delta_f$ (KHz) |
|---|---|
| −20 | −225 |
| −15 | −170 |
| −10 | −115 |
| −5 | −60 |
| 0 | 0 (default) |
| 2 | 30 |
| 4 | 50 |
| 6 | 75 |
| 8 | 110 |
| 10 | 154 |
| 12 | 230 |
| 15 | 314 |

Referring to Table 2, the value of $\Delta_f$ may increase as $\Delta V_{FX2-FX1}$ increases. In one example according to the present invention, Table 2 may be expanded to cover more comparison values in the same comparison range between −20 dB and 15 dB or in other desirable comparison ranges. Also referring to FIG. 4A, such an expanded table may be built in a lookup table (LUT) 131. The LUT 131 may allow for interpolation and extrapolation in a predetermined comparison range. With the measured $\Delta V_{FX2-FX1}$, the micro controller 13 may be configured to generate the corresponding $F_c(=F_{IF}+\Delta_f)$, or equivalently, $F_{IF,AD}$ value by finding the $\Delta_f$ value from the LUT (131) and add it to the nominal IF frequency, $F_{IF}$. Moreover, based on the $F_{IF}+\Delta_f$ value, the fractional LO generator 113 may generate the LO signals at the oscillating frequency $F_{LO}=F_{RF}-(F_{IF}+\Delta_f)$, and the BPFs 114, 115 and the down-conversion to baseband 123 in the BB section 12 may function at an adaptive intermediate frequency $F_{IF,AD}=F_{IF}+\Delta_f$.

As mentioned in the above, one may not know the process corner. The temperature measurement may not be absolutely accurate. However, the temperature difference can be accurately measured. Although one can simply repeat the two-tone measurements immediately before the adaptive receiver is used, it is not quite convenient in the presence of temperature changes. In that case, the following simplified calibration procedure can be used to accurately estimate the $F_{IF,AD}$, and hence, $F_{LO}$. It is assumed that the temperature during Steps 1 to 3 below remains unchanged.

A Simplified Calibration Procedure Based on Two-Tone Measurements:

Step 1: After power on, use the temperature sensing device 14 illustrated in FIG. 4A to detect the ambient temperature, and record as $T_{on}$;

Step 2: Use the loop-back mode as described in the above using FIG. 4B, and the modulator 20 outputs 2 test tones $F_{x1}=f_{IF}-0.8$ MHz, and $F_{x2}=f_{IF}+0.8$ MHz, then record the difference as $\Delta V_{FX2-FX1}$, where $f_{IF}=1.248$ MHz (the nominal IF frequency) and 0.8 MHz is the 3-dB bandwidth of the band pass filter;

Step 3: Determine the $\Delta_f$ value from the LUT 131;

Step 4: When operating at a different temperature (say $T_{op}$, as measured by the temperature sensing device 14), compute $$F_{LO}=F_{RF}-(F_{IF}+\Delta_f+F_{slope}F_{slope}\times\Delta_T)$$

based on the temperature difference $\Delta_T=T_{on}-T_{op}$, where $F_{slope}$ is the $F_{IF}+\Delta_f$ slope coefficient related to temperature difference $\Delta_T$.

End of Calibration Procedure.

Figure 6:
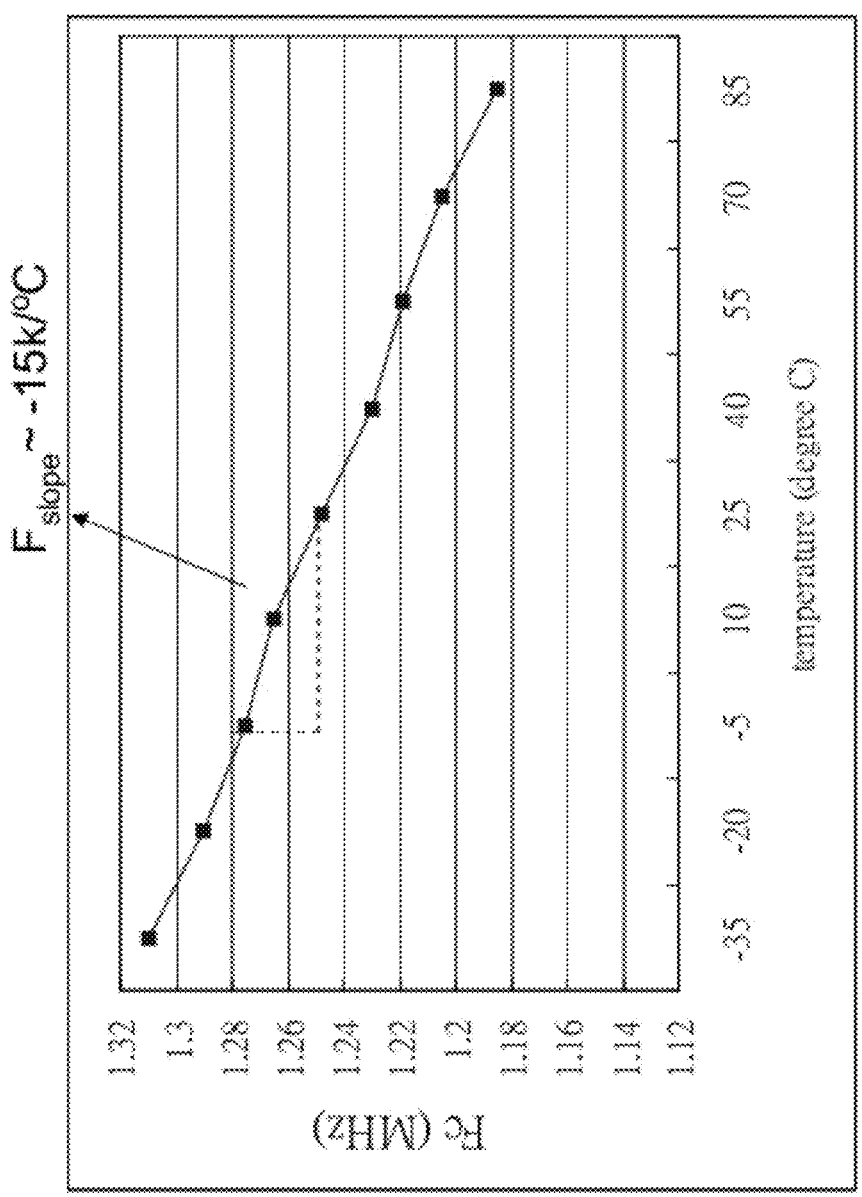
FIG. 6 shows an example of measurement results for the band pass filter center frequency $F_C$ variations (in MHz) vs. temperature (degree C.).

FIG. 6 shows an example of measurement results for the band pass filter center frequency $F_C$ variations (in MHz) vs. temperature (degree C.). One can observe that $F_{slope}$ is approximately −15 KHz/° C.

When referring to FIG. 4A, one can again have an expanded Table 2 together with the $F_{slope}$ value pre-stored in a look-up table (LUT) 131. The LUT 131 may allow interpolation and extrapolation in a predetermined comparison range. After power-on two-tone measurements, the micro controller 13 may be configured to generate the corresponding $F_c(=F_{IF}+\Delta_f)$, or equivalently, $F_{IF,AD}$ value at $T_{on}$ by finding the $\Delta_f$ value from the LUT (131) and add it to the nominal IF frequency $F_{IF}$. The power-on temperature $T_{on}$ is also stored in a register. When operating at a different temperature $T_{op}$, the microprocessor finds $\Delta_T$ and based on the $F_{slope}$ and $F_{IF}+\Delta_f$ values, the fractional LO generator 113 may generate the LO signals at the frequency $F_{LO}=F_{RF}-(F_{IF}+\Delta_f+F_{slope}\times\Delta_T)$, and the BPFs 114, 115 and the down-conversion to baseband 123 in the BB section 12 may function at an adaptive intermediate frequency $F_{IF,AD}=F_{IF}+\Delta_f+F_{slope}\times\Delta_T$.

Figure 5A:
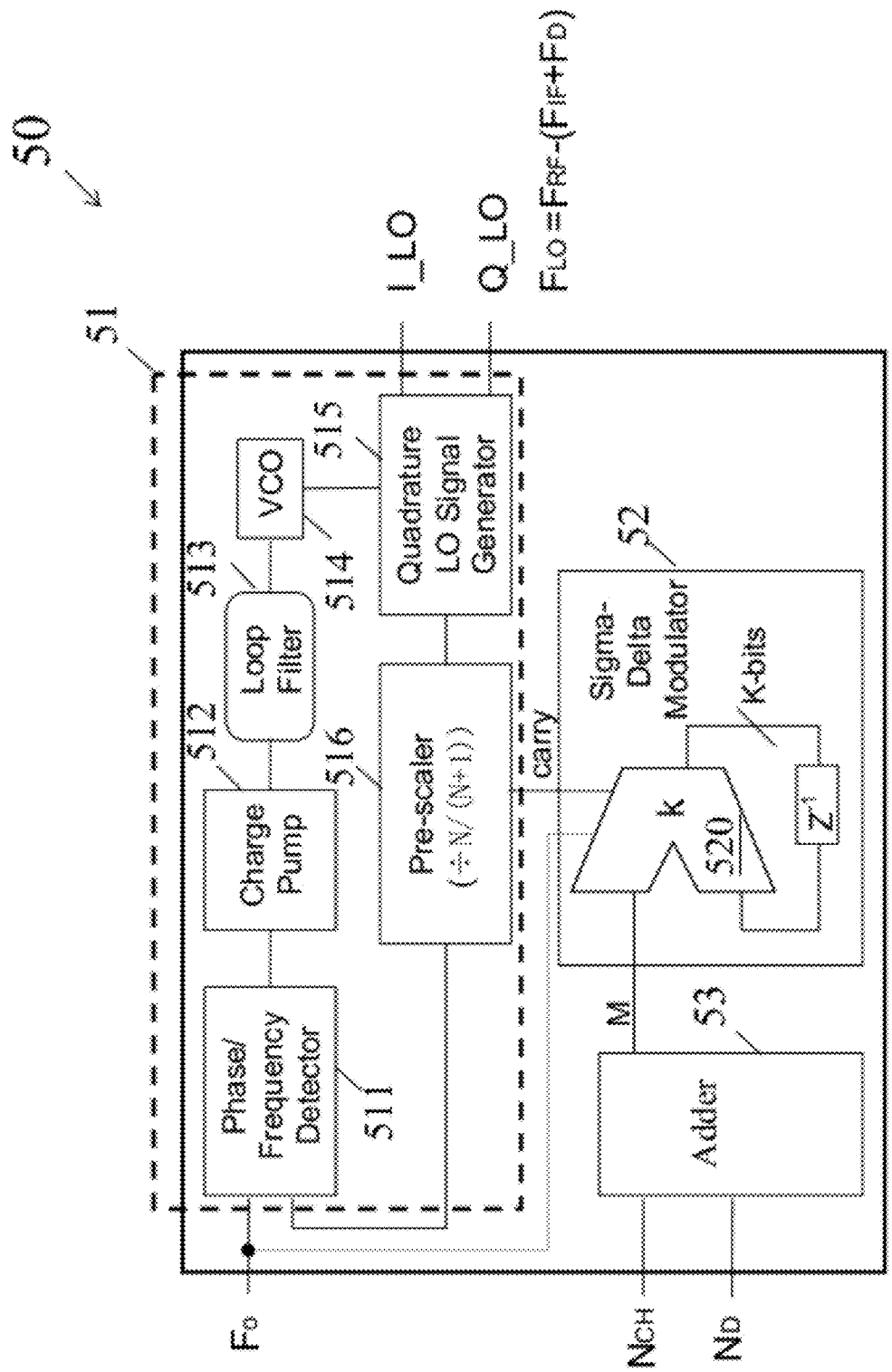
FIG. 5A is a block diagram of a local oscillator consistent with an example of the present invention.

FIG. 5A is a block diagram of a local oscillator 50 consistent with an example of the present invention. Referring to FIG. 5A, the local oscillator 50, which may serve as the LO generator 17 described and illustrated with reference to FIG. 4A, may include a phase locked loop (PLL) 51 and a sigma-delta modulator 52. The PLL 51 may further include a phase-frequency detector (PFD) 511, a charge pump 512, a loop filter 513, a voltage-controlled oscillator (VCO) 514, a quadrature signal generator 515 and a prescaler 516. The PFD 511 may receive a clock signal at a reference frequency $F_0$ and a feedback signal from the prescaler 516 as inputs, compare the frequencies of two input signals and generate an output voltage to serve as an error signal, which is proportional to the difference between the input frequencies. The error signal may be sent to the VCO 514 via the charge pump 512 and the loop filter 513, and may be used to drive the VCO 514, which in turn may create an output frequency. In one example, the output frequency may be approximately 4.8 GHz so that the quadrature signal generator 515 may generate I_LO and Q_LO signals at approximately 2.4 GHz.

An output signal from the quadrature signal generator 515 may be fed through the prescaler 516 back to an input of the PFD 511, producing a negative feedback loop. If no error occurs, the frequency of the output signal is approximately 2.4 GHz. If the output frequency drifts, the error signal may increase, driving the frequency in the opposite direction so as to reduce the error. Thus the output is locked to the frequency at the other input, i.e., the reference clock.

The prescaler 516 may be operable in at least two modes with each mode having assigned a different prescaler factor. In the present example, the prescaler 516 may be configured to divide the frequency of the output signal from the quadrature signal generator 515 by a first prescaler factor "N" until a carry signal is provided thereto, N being a positive integer. The carry signal may be generated every M cycles of the reference clock and, when provided to the prescaler 516, may switch the division modulus from the first prescaler factor N to a second prescaler factor N+1.

The sigma-delta modulator 52 may further include an accumulator 520 and a delay element denoted as $Z^{-1}$. The accumulator 520 may be configured to generate a carry signal for changing the mode of the prescaler 516. A summing device 514 such as an adder may be used to calculate the sum of a first value $N_D$ and a second value $N_{CH}$. The generation of the carry signal may be done by storing a sum value of $N_D$ and $N_{CH}$ and processing a modulus function for updating the sum value. When the sum value reaches M, a carry signal may be generated. In the present example, $N_D$ and $N_{CH}$ are related to a mean division ratio $N_f$, which may be expressed in an equation given below.

$$N_f = \frac{F_{RF}}{F_0} \quad \text{(Equation 1)}$$

$$= \frac{(2^k - M) \times N + M \times (N+1)}{2^k}$$

$$= N + \frac{M}{2^k}$$

Wherein k is the bit width of the carry signal and M, by definition, is equal to $N_D + N_{CH}$. The oscillating frequency $F_{LO}$ of the local oscillator 50 may be equal to the product of the reference frequency $F_0$ and the division ratio $N_f$ and thus may be written as follows.

$$F_{LO} = F_0 \times N_f \quad \text{(Equation 2)}$$

$$= F_0 \times \left(N + \frac{M}{2^k}\right)$$

$$= F_0\left\{\left(N + \frac{N_{CH}}{2^k}\right) + \frac{N_D}{2^k}\right\}$$

$$= F_{RF} - (F_{IF} + \Delta_f)$$

Given the above Equation 2, the terms ($F_{RF} - F_{IF}$) and $\Delta_f$ in $F_{LO}$ may be defined in equations as given below.

$$F_{RF} - F_{IF} = F_0\left(N + \frac{N_{CH}}{2^k}\right) \quad \text{(Equation 3)}$$

$$\Delta_f = F_0 \frac{N_D}{2^k} = F_s \times N_D \text{ where } F_s = \frac{F_0}{2^k} \quad \text{(Equation 4)}$$

Given $F_{RF}$=2403.2 MHz, $F_0$=16M and k=12, we may obtain $$N_f = 2403.2/16$$

$$= 150.2$$

$$= 150 + 0.2$$

$$= N + \frac{M}{2^k}$$

That is, N=150 and M (=0.2×4096=819.2) is rounded to 819, the closest integer.

Figure 5B:
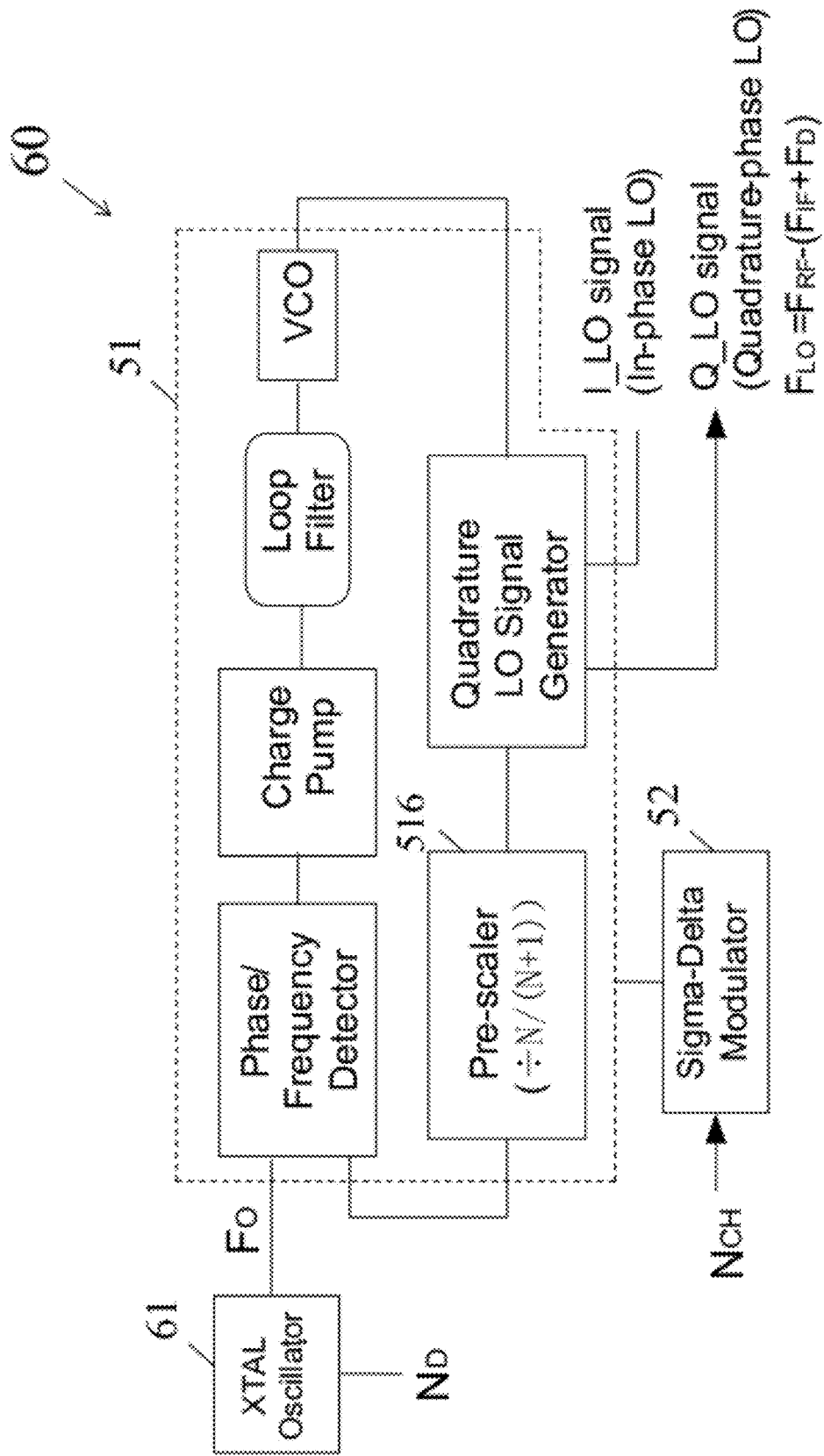
FIG. 5B is a block diagram of a local oscillator consistent with another example of the present invention.

FIG. 5B is a block diagram of a local oscillator 60 consistent with another example of the present invention. Referring to FIG. 5B, the local oscillator 60, which may serve as the LO generator 17 illustrated in FIG. 4A, may be similar to the local oscillator 50 described and illustrated with reference to FIG. 5A except that, for example, $N_D$ may be used to trim a crystal oscillator 61 that generates the reference clock at $F_0$. Specifically, $N_D$ may be related to a trimming ratio $$\left(1 + \frac{N_D}{2^b}\right)$$

of the reference frequency $F_0$, b being the bit width of $N_D$ provided to the crystal oscillator 61. Furthermore, $N_{CH}$ may be related to a division ratio $$\left(N + \frac{N_{CH}}{2^k}\right)$$

of the prescaler 516. The oscillating frequency $F_{LO}$ of the local oscillator 60 may be equal to the product of the reference frequency $F_0$, the trimming ratio $$\left(1 + \frac{N_D}{2^b}\right)$$

the division ratio $$\left(N + \frac{N_{CH}}{2^k}\right),$$

and may be written as follows.

$$F_{LO} = F_0\left(1 + \frac{N_D}{2^b}\right) \times \left(N + \frac{N_{CH}}{2^k}\right)$$

$$= F_0\left(N + \frac{N_{CH}}{2^k}\right) + F_0\left\{\frac{N_D}{2^b} \times \left(N + \frac{N_{CH}}{2^k}\right)\right\}$$

$$= (F_{RF} - F_{IF}) - \Delta_f$$

Given the above equation, the terms ($F_{RF}$–$F_{IF}$) and $F_D$ in $F_{LO}$ may be defined as given below.

$$F_{RF} - F_{IF} = F_0\left(N + \frac{N_{CH}}{2^k}\right) \text{ and } \Delta_f = -F_0\left\{\frac{N_D}{2^b} \times \left(N + \frac{N_{CH}}{2^k}\right)\right\}$$

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. An adaptive receiver for receiving a radio frequency (RF) signal and converting the RF signal at a frequency $F_{RF}$ toward an intermediate frequency (IF) signal at a frequency $F_{IF,AD}$, the adaptive receiver comprising:
   a pair of band pass filters, each with a nominal center frequency at $F_{IF}$;
   a two-dimensional look-up table configured to provide frequency offset ($\Delta_f$) values of the center frequency of the band pass filters for environmental temperature and process corner variations;
   a temperature sensing device to provide temperature information;
   a micro controller configured to, based on the frequency offset ($\Delta_f$) values from the look-up table, the temperature information from the temperature sensing device and pre-stored information on the process corner, estimate an adaptive intermediate frequency $F_{IF,AD}$ equal to the nominal center frequency of the band pass filter, $F_{IF}$, plus the frequency offset $\Delta_f$; and
   a local oscillator to generate sinusoidal signals at a frequency $F_{LO}$ equal to $F_{RF}$ minus $F_{IF,AD}$.

2. The adaptive receiver of claim 1 further comprising two mixers each comprising:
   a first input to receive the received RF signal; and
   a second input to receive one of a first and a second local oscillator (LO) signals at the frequency $F_{LO}=F_{RF}-F_{IF,AD}=F_{RF}-(F_{IF}+\Delta_f)$, wherein the first LO signal and the second LO signal are orthogonal to one another in phase.

3. The adaptive receiver of claim 2 further comprising a low noise amplifier to amplify the received RF signal.

4. An adaptive receiver for receiving a radio frequency (RF) signal and converting the RF signal at a frequency $F_{RF}$ toward an intermediate frequency (IF) signal at a frequency $F_{IF,AD}$, the adaptive receiver comprising:
   a pair of band pass filters, each with a nominal center frequency at $F_{IF}$;
   a one-dimensional look-up table configured to provide an intermediate frequency offset $\Delta_f$ as a function of the difference between two tone voltages, $\Delta V_{FX2-FX1}$;
   wherein the voltage difference $\Delta V_{FX2-FX1}$ ($=V_{FX2}-V_{FX1}$) is determined based on measured voltages $V_{FX2}$ and $V_{FX1}$ for two frequencies;
   a micro controller configured to, using the $\Delta V_{FX2-FX1}$ value, determine the frequency offset $\Delta_f$ from the one-dimensional look-up table and compute an adaptive intermediate frequency $F_{IF,AD}$ equal to the sum of the nominal intermediate frequency $F_{IF}$ and $\Delta_f$; and
   a local oscillator to generate sinusoidal signals at a frequency $F_{LO}$ equal to $F_{RF}$ minus $F_{IF,AD}$.

5. The adaptive receiver of claim 4 further comprising two mixers each comprising:
   a first input to receive the received RF signal after amplification by a low noise amplifier; and
   a second input to receive one of a first and a second local oscillator (LO) signals with the same frequency ($F_{LO}=F_{RF}-F_{IF,AD}=F_{RF}-(F_{IF}+\Delta_f)$) and a 90-degree phase difference.

6. An adaptive receiver for receiving a radio frequency (RF) signal and converting the RF signal at a frequency F toward an intermediate frequency (IF) signal at a frequency $F_{IF,AD}$, the adaptive receiver comprising:
   a band pass filter with a nominal center frequency at $F_{IF}$;
   a one-dimensional look-up table configured to provide an intermediate frequency offset $\Delta_f$ as a function of the difference of two tone voltages, $\Delta V_{FX2-FX1}$;
   wherein the voltage difference $\Delta V_{FX2-FX1}$ ($=V_{FX2}-V_{FX1}$) is determined after the adaptive receiver is powered on at temperature $T_{on}$, based on measured voltages $V_{FX2}$ and $V_{FX1}$ for two frequencies;
   a temperature sensing device to detect the temperature difference $\Delta_T$ ($=T_{on}-T_{op}$) between an operating temperature $T_{op}$ and the temperature $T_{on}$;
   a micro controller configured to, using the $\Delta V_{FX2-FX1}$ value, determine the frequency offset $\Delta_f$ from the one-dimensional look-up table and compute an adaptive intermediate frequency $F_{IF,AD}$ equal to the sum of the nominal intermediate frequency $F_{IF}$, $\Delta_f$ and $F_{slope} \times \Delta_T$, where $F_{slope}$ is the $F_{IF}+\Delta_f$ slope coefficient related to temperature difference $\Delta_T$; and
   a local oscillator to generate sinusoidal signals at a frequency $F_{LO}$ equal to $F_{RF}$ minus $F_{IF,AD}$.

7. The adaptive receiver of claim 6 further comprising two mixers each comprising:
   a first input to receive the received RF signal after amplification by a low noise amplifier; and
   a second input to receive one of a first and a second local oscillator (LO) signals with the same frequency ($F_{LO}=F_{RF}-F_{IF,AD}=F_{RF}-(F_{IF}+\Delta_f+F_{slope}\times\Delta_T)$) and a 90-degree phase difference.

* * * * *